United States Patent
Inganäs et al.

(10) Patent No.: US 6,966,997 B1
(45) Date of Patent: Nov. 22, 2005

(54) METHODS FOR PATTERNING POLYMER FILMS, AND USE OF THE METHODS

(75) Inventors: Olle Inganäs, Linköping (SE); Tobias Nyberg, Linkoping (SE); Tomas Granlund, Linkoping (SE)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 09/720,259

(22) PCT Filed: May 12, 2000

(86) PCT No.: PCT/NO00/00157

§ 371 (c)(1),
(2), (4) Date: Feb. 2, 2001

(87) PCT Pub. No.: WO00/70406

PCT Pub. Date: Nov. 23, 2000

(30) Foreign Application Priority Data

May 12, 1999 (NO) .................................. 992295

(51) Int. Cl.[7] .............................................. B44C 1/24
(52) U.S. Cl. ........................ 216/36; 216/54; 216/67; 427/536; 427/552; 427/271; 427/393.5; 101/483; 101/492
(58) Field of Search ............................ 216/36, 40, 54, 216/67; 427/536, 552, 271, 393.5; 101/483, 101/492

(56) References Cited

U.S. PATENT DOCUMENTS 5,358,604 A 10/1994 Lin et al. .................... 156/664
5,512,131 A 4/1996 Kumar et al. ............. 156/655.1

OTHER PUBLICATIONS

James et al. Langmuir 1998, 14, pp 741-744.*
Rogers et al. Adv Mater. 1999 11, 9 pp 741-745.*
RD 419100 A (Int. Business Machines Corp) Feb. 20, 1999 Contact Inking Stamps for Microcontact Printing Alkanethiois on Gold.
Gupta, V.K. et al. Design of Surfaces For Patterned Alignment of Liquid Crystals on Planar And Curved Substrates. SCIENCE Jun. 1997, vol. 276, 5318 pp. 1533-1536, ISSN 0036-8075.
Aksay, I.A. et al. Biomimetic Pathways For Assembling Inorganic Thin Films, SCIENCE, Aug. 1996, vol. 273 5277 pp. 892-897, ISSN 0036-8075.

(Continued)

Primary Examiner—Allan Olsen
(74) Attorney, Agent, or Firm—Jacobson Holman PLLC

(57) ABSTRACT

In a method for patterning a polymer film forming a coating on a material surface, a thin film of polymer is deposited on the surface and the patterning takes place by applying to the material surface a stamp made of an elastomeric material in conformal contact with the surface of the thin film, such that portions thereof contacting one or more protruding elements of the elastomeric stamp formed by one or more indentations thereof, are attached to the protruding element or elements and removed from the material surface with the stamp. In a method for transferring a patterned polymer film onto a material surface, a thin film polymer is deposited on a stamp surface and the stamp is applied in conformal contact with the material surface, such that thin film of polymer is transferred thereto from one or more protruding elements of the elastomeric stamp formed by at least one indentation thereof, thus leaving a patterned thin film of polymer on the material surface when removing the stamp therefrom. Use for patterning an etched resist in the form of a thin film of polymer on a gold layer.

19 Claims, 2 Drawing Sheets

PEEL OFF STAMP AND STAMP-ADHERED PEDOT

OTHER PUBLICATIONS

Figure 1:
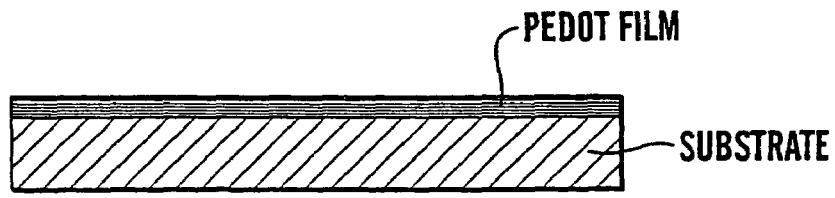

Zhao, X-M Microfabrication using soft lithography (waveguides, self assembled monolayers, surface defects, shrinkable polystyrene, etching), 1998, vol. 59/10-B of dissertation abstracts international side 5538. 234 sider. (sammendrag) Dissertation Abstracts Online. Bell & Howell Information and Learning, 300 North Zeeb Road, Ann Arbor, MI . . . .

Xia, Y. Soft Lithography: Micro- and nanofabrication based on micro contact printing and replica molding. 1996, vol. 57/10-B of dissertation abstracts international side 5538. 307 sider. Dissertation Abstracts Online. Bell & Howell Information and Learning . . . .

* cited by examiner

SPIN PEDOT FILM ON SUBSTRATE

APPLY STAMP AND HEAT

PEEL OFF STAMP AND STAMP-ADHERED PEDOT

METHODS FOR PATTERNING POLYMER FILMS, AND USE OF THE METHODS

The present invention concerns a method for patterning a polymer film forming a coating on a material surface, wherein the patterning takes place by means of a stamp having a surface with at least one indentation formed therein, and a method for transferring a patterned polymer film onto a material surface by means of a stamp having a surface with at least one indentation formed therein. The invention also concerns the use of methods of this kind.

The use of conjugated polymers in electronic devices requires means for processing them into patternable thin films. Patterning conducting electrodes and semiconducting polymers in polymer diodes requires patterning of all materials, at a resolution of 0.1–50 $\mu$m. This can possibly be accomplished by the use of classical photolithography with help of photoresists, but several new problems arise in the chemical etching of the material and the chemical compatibility with conventional photoresists. It would therefore be desirable to pattern this material with non-photolithographic techniques.

A new method for patterning is based on elastomeric stamps. Patterning of a surface here requires conformal contact between the stamp and surface. Many variants of these techniques are documented, in particular in the work from G. Whitesides' group at Harvard University (Y. Xia and G. Whitesides, Soft lithography, Angewandte Chemie-International Edition in English 37(5): 551–575 (1998) and Y. Xia and G. Whitesides, Soft lithography, Annual Review of Materials Science, 28:153–184 (1998)).

The work of Whitesides' group is disclosed in U.S. Pat. No. 5,512,131, titled "Formation of microstamped patterns on surfaces and derivative articles" (Kumar & Whitesides). This prior art document discloses a method of patterning a material surface, comprising steps of providing a stamp having a surface including at least one indentation formed therein, said indentation configured with a stamping surface defining a first pattern; coating said stamping surface with a molecular species terminating at the first end in a functional group selected to bind to said material; processing said stamping surface in a first orientation and contacting a portion of said material surface with said stamping surface to hold said molecular species against said material surface portion to allow said functional group to bind thereto; and removing said stamping surface to provide a self-assembled molecular species on said material surface according to said first pattern in said first orientation.

This prior art disclosure amounts to a process wherein a chemical species capable of forming a self-assembled monolayer is coated onto the stamping surface of an elastomeric stamp, said species having a functional group selected to bind to a particular material. The stamping surface is placed against a surface of a material surface and removed to leave a self-assembled monolayer of the species according to the stamping surface pattern of the stamp.

Further there is known a number of different prior art techniques for patterning surfaces or materials deposited thereon without having to resort to conventional photolithography.

As a further example of prior art a paper by Zhang, L. G.; Liu, J. F. and Lu, Z. H., titled "Microfabrication on polymer with a contact procedure", Supramolecular Science, Vol. 5, Nos. 5–6:713–715 (October–December 1998) discloses the fabrication of thickness-contrast micropatterns based on a contact procedure. Polymer (polydimethylsiloxane) micropost arrays are fabricated with grids as the masters. This contact procedures which does not rely on etching, extends the present limits of microfabrication. In addition the thickness-contrast micropatterns on the polymer can be replicated to other substrates, such as silicon wafers, with microcontact printing.

These techniques that are collected in the catchall term soft lithography are based on pattern transfer by a soft rubber stamp in direct contact with the surfaces and materials to be patterned. Soft lithography includes microcontact printing ($\mu$CP), replica molding (REM) and micromolding in capillaries (MIMIC). The patterning technique is based on physical contact, not the projection of light through a mask, as in photolithography. The fundamental limits to resolution are due to the range of the van der Waals forces determining the interaction of surfaces (~10 nm), not the diffraction of light in far-field geometries (~0.5 $\mu$m).

An important element of microcontact printing ($\mu$CP) is the formation, by selfassembly, of a monomolecular layer of etch resistant organic molecules. Alkanethiols are the preferred species, which chemisorb into molecular thin films on Au, Ag, Cu and other metal surfaces. They form layers of very small thickness (1–3 nm) which are tightly bound (but can be desorbed at high temperatures and by exchange). These alkane layers are used as the resist; a metal layer is protected from etching below the molecular film, and where it is not deposited the metal is removed. The patterning of the resist layer is in its turn done with molecular stamps. A poly(dimethylsiloxane) (PDMS) layer, patterned with protruding and recessed elements in a prior step, is exposed to a solution of alkanethiols; the rubbery stamps are pressed onto a surface for a short time; alkanethiols react with the gold surface when close contact is obtained; and a pattern of protected and non-protected Au is obtained. This layer is now exposed to another alkanethiol, adsorbing from solution onto the unprotected gold surface. A patterned layer is obtained. The process is called microcontact printing ($\mu$CP). It has been established that formation of the patterned structure occurs within a few seconds.

The patterned layer may now be used as ultrathin resists in selective wet etching, or as templates for the control of wetting, dewetting, nucleation and growth or deposition of other materials. Minimal sizes of 35 nm trenches in Au layers have been obtained with etching techniques.

Patterned self-assembled monolayers (SAMs) allow control of the local hydrophobic/hydrophilic nature of the surface, and therefore act to control the deposition of materials. Water will condense on the hydrophilic part of the surface; this allows us to deposit materials from water solution onto a patterned surface in a regular fashion. Likewise, organic polymers may be deposited onto the hydrophobic surfaces from organic solvents. Both these approaches allow the formation of patterned structures of deposited material. Selective chemical vapour deposition (CVD) processes onto SAMs controlling the nucleation behaviour is another approach for pattern formation in ceramics and metals. Proteins and cells can be selectively adsorbed on patterned surfaces.

It is easy to pattern non-planar surfaces with this approach, a near impossibility with photolithography. Capillaries of radius of curvature 50 $\mu$m have been patterned with structures of dimensions down to a few microns. This enables the construction of more complex structures on patterned and non-planar surfaces, relieving one of the tyranny of planar photolithography.

The microcontact printing is simple, inexpensive and flexible. With bigger structures (>20 $\mu$m) clean room facilities are not necessary. The stamp can be used and reused many times, providing high fidelity reproduction. Because the master structure is normally used as a template to prepare "negatives" (as it were), one can form many identical stamps from a single master, and each one of them can be used some hundred times—multiple copying and parallel processing of the structures is therefore possible. The capital cost of producing the structures is very low. The fabrication of masters of course requires other lithographical techniques, such as photolithography or electron beam lithography, but the multiplication of stamps gives parallel production lines. Micromolding is a small twist to classical molding in that a soft and flexible silicone rubber is used, rather than a hard mold. The elasticity and low surface energy of this mold material allows it to be removed easily from the prepared structure. Replica-molding (REM) can be obtained down to the 30 nm dimensions. Such methods may be used to prepare optical structures as in gratings, microlenses, Fresnel lenses and similar designs for the diffraction and refraction of light. Microprinting is best obtained with the technique named micro-transfer molding ($\mu$TM) where a patterned mold is filled with a liquid prepolymer, excess liquid removed and the mold pressed against a surface, irradiated or heated to polymerize. After the liquid precursor is converted into a solid, the mold is peeled away. In a slight modification of this technique (micromolding in capillaries, MIMIC) connected structures are placed in contact with low viscosity liquids, which fill the channels by capillary action. These liquids may carry nanoparticles, or solutions for solgel conversion, or polymers in solution. After conversion of the liquid to a solid, the mold is removed. Processing of the resulting structure by photochemistry or thermal treatment is now possible, for instance converting a precursor to carbon materials. The remaining structure may now be the functional element—such as an optical waveguide—or a resist to be used to etch the underlying material. In a slight twist to this method, SAMIM (solvent assisted MIMIC), a solvent is used to modify the sample surface to be patterned, and the patterned is defined with a micromold in which the structure is defined.

The very important aspect of faithful reproduction over large areas and with low defect density is not yet fully resolved. In a recent report from IBM Zurich, it is claimed that structures of 1 micrometer pitch were faithfully replicated without defects over areas of 10 $cm^2$, using $\mu$CP or MIMIC.

Patterning of monolayers of molecules is the most elegant and novel of these prior art methods, but is limited to transfer of monolayers, subsequently used for etch resists and surface activating elements. Transfer of polymer patterns is normally done with MIMIC and microcontact printing. In MIMIC a polymer precursor is patterned by filling channels defined by applying a stamp onto a surface; in microcontact printing a polymer (precursor) fills the channels turned upside down, in such a way as to form the structure which is then transferred to the surface. Transfer of polymer layers to functionally modified surfaces has been reported; see L. Yan, W. T. S. Huck, X. M. Zhao, and G. M. Whitesides, Patterning thin films of poly(ethylene imine) on a reactive SAM using microcontact printing, Langmuir, 15(4): 1208–1214 (1999).

The patterning of polymers, and in particular conjugated polymers has been reported (see Z. Huang, P. C. Wang, J. Feng, A. G. MacDiarmid, Y. Xia, and G. M. Whitesides, Selective deposition of films of polypyrrole, polyaniline and nickel on hydrophobic/hydrophilic patterned surfaces and applications, Synthetic Metals, 85(1–3):1375–1376 (1997); and Z. Y. Huang, P. C. Wang, A. G. MacDiarmid, Y. N. Xia, and G. Whitesides, Selective deposition of conducting polymers on hydroxyl-terminated surfaces with printed monolayers of alkylsiloxanes as templates, Langmuir 13(24): 6480–6484 (1997)) using hydrophobic/hydrophilic modification of monomer adhesion. It may be difficult to deposit high quality polymers from dispersions and solutions with the materials used in these stamps; in particular, the swelling of a poly(dimethylsiloxane) stamp in chloroform prevents the patterning of many of the luminescent polymers used for electroluminescent polymer displays where patterning is desired. These polymers are often solvated in solvents such as chloroform. Likewise, the patterning of water-soluble polymers prohibits the use of some soft lithography techniques, such as MIMIC (Y. Xia and G. Whitesides, Soft lithography, Angewandte Chemie-International Edition in English 31(5): 551–575 (1998) and Y. Xia and G. Whitesides, Soft lithography, Annual Review of Materials Science, 28:153–184 (1998)) as the solvent is required to pass through an elastomeric membrane. Chloroform will swell the stamp, and destroy the fine pattern to be transferred; in the other extreme, water is not easily transported through the extremely non-polar elastomeric stamp, and pattern transfer will be prohibited. Novel patterning methods are therefore desired.

In regard of certain drawbacks and limitations of the above-mentioned prior art methods, it is thus an object of the present invention to provide methods whereby patterns can be generated in thin films of polymer deposited on material surface by a simple and inexpensive technique based on the use of a specially designed stamp for generating the patterns. Particularly it is another object of the present invention to be able to pattern thin film of polymers which initially form continuous layers and moreover exhibit advantageous electronic or optical properties, e.g. for use as pattern electrodes or pixels in optoelectronic displays.

Finally, it is also an object of the invention to provide patterned thin films of polymer on a substrate in order to facilitate specific processing of the substrate.

The above-mentioned objects and advantages are realized with a method for patterning a polymer film according to the invention the method being characterized by depositing onto the material surface a thin film of polymer, applying to the material surface the stamp made of an elastomeric material in conformal contact with the surface of the thin film, such that portions thereof contacting one or more protruding elements of the elastomeric stamp, the formed by the at least one indentation thereof, are attached to the protruding element or elements and removed from the material surface with the stamp.

According to the invention the polymer can advantageously be modified by incorporating additives in order to reduce the cohesive binding of the polymer film, in which case an additive can be a water-soluble organic compound, or selected among ethylene glycol, poly(ethylene glycol), glycerol, sorbitol, polyol, or any combinations thereof.

According to the invention the polymer can be a water-soluble or dispersed polymer, or a conducting conjugated polymer in its doped or undoped state, or poly(3,4-dioxyethylenethiophene) (PEDOT) or deriving from a copolymer thereof, or one or more mixtures incorporating the monomer (EDOT) form.

According to the invention it is advantageous modifying the material surface in order to provide a weak adhesion between the material surface and the polymer film to be removed therefrom, and then preferably modifying the material surface by plasma etching.

According to the invention it is also advantageous modifying the elastomer stamp surface in order to provide a strong adhesion between the stamp and the polymer film to be attached thereto, and then preferably modifying the elastomer stamp surface by plasma etching.

Finally it is according to the method of the invention advantageous enhancing the adhesion between stamp and polymer film by means of additives to the latter, an additive then preferably being glycerol.

The above-mentioned object and advantages are also realized according to the present invention with a method for transferring a polymer film, the method being characterized by depositing onto the stamp surface a thin film of polymer, applying the stamp made of an elastomeric material in conformal contact with the material surface, such that the thin film of polymer is transferred thereto from one or more protruding elements of the elastomeric stamp formed by the at least one indentation thereof, and leaving a patterned thin film of polymer on the material surface when removing the stamp therefrom.

In the above method according to the invention it is advantageous modifying the polymer film by incorporating additives in order to reduce the cohesive binding of the polymer film, the additive then preferably being a water-soluble organic compound, or preferably selected an additive among ethylene glycol, poly(ethylene glycol), glycerol, sorbitol, polyol, or any combinations thereof.

In the above method according to the invention it is advantageous that the polymer film is a water-soluble or dispersed polymer, or that the polymer is a conducting conjugated polymer in its doped or undoped state, or poly (3,4-dioxyethylenethiophene) (PEDOT) or deriving from a copolymer thereof, or one or more mixtures incorporating the monomer (EDOT).

In the above method according to the invention it is advantageous modifying the elastomer stamp surface in order to provide a weak adhesion between the elastomer surface and the polymer film to be removed therefrom, and then preferably modifying the elastomer stamp surface by plasma etching.

In the above method according to the invention it is advantageous modifying the material surface in order to provide a strong adhesion between the material surface and the polymer film to be transferred thereto, and then preferably modifying the material surface by plasma etching.

Finally the above mentioned objects and advantages are provided with the use of the method for patterning or the method for transferring to provide a patterned etch resist in the form of a thin film of polymer on a gold layer, whereby the gold layer can be removed by etching of the area unprotected by the resist, the polymer preferably being PEDOT.

Further features and advantages of the method according to the invention are apparent from the appended dependent claims.

The invention shall now be described in a general manner and in connection with the appended drawing figures in case of one of the methods, as well as with a reference to exemplary embodiments of both the methods.

Figure 2:
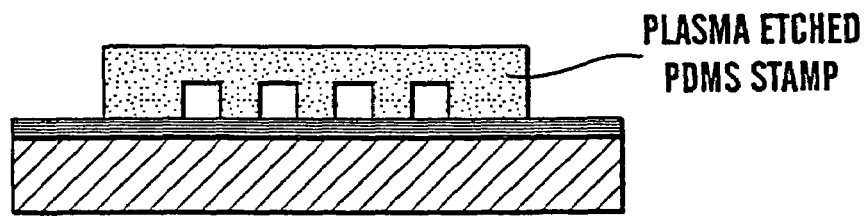
Figure 3:
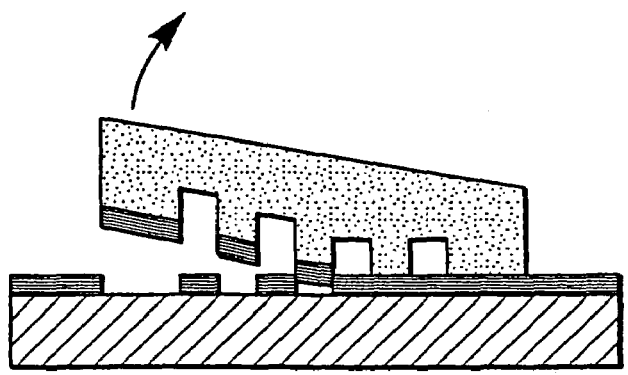
Figure 4:
Figure 5:
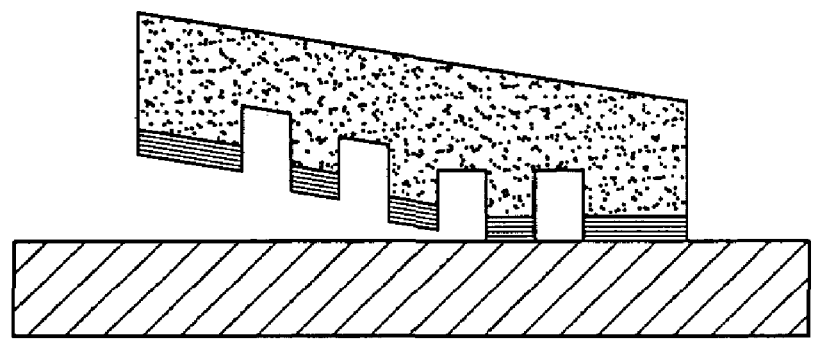
Figure 6:
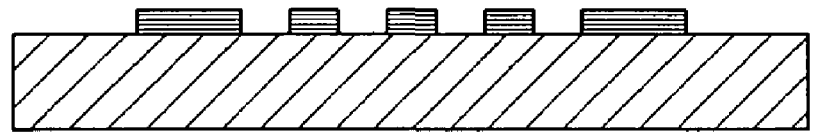

In the drawing figures,

FIG. 1 shows the deposition of a thin film of polymer on a substrate,

FIG. 2 the application of a stamp to the thin film polymer,

FIG. 3 schematically the patterning of the thin film of the polymer,

FIGS. 4 through 6 schematically illustrate a reverse application from that shown in FIGS. 1–3 and represent, as described in the examples, a "put-down" method.

A particular polymer of great interest in these devices is the poly(3,4-dioxoethylenethiophene) (PEDOT) which is a commercial polymer from Bayer AG. It is produced in the form of an aqueous dispersion, and can be coated, e.g. spin-coated onto a surface to form a thin film. This film has very attractive properties for polymer electronic devices as it for instance enhances the stability and efficiency of polymer light emitting diodes, or the hole collection in polymer photodiodes, or the hole injection in metal/PEDOT/polymer structures. It is, however, difficult to pattern this polymer dispersion with the hydrophobic polydimethylsiloxane (PDMS) stamp in the MIMIC method. Thus the present invention provides alternative methods of patterning PEDOT films.

One of the requirements for the use of this patterned film is that sufficient electrical conductivity can be obtained to allow the polymer to be used as the electrode in devices. Surprisingly, the patternable film is obtained with similar additives which has been shown to give enhanced electrical conductivity, up to 80 S/cm, after thermal curing.

In these methods according to the present invention, a film of modified PEDOT is deposited on the surface to be patterned by spin coating, and patterning is done by removing parts of the film with a suitable elastomer stamp. This is the first method according to the invention and shall subsequently be termed "Lift-up". In the alternative method, a modified PEDOT layer is deposited on the stamp and then transferred onto the surface to be patterned. This is the second method according to the invention and subsequently termed "Put-down".

These methods are superior to prior art in that they allow patterning of very large areas on (non-planar) surfaces. It is documented in the literature (see Y. Xia and G. Whitesides, Soft lithography, Angewandte Chemie-International Edition in English 37(5): 551–575 (1998); and Y. Xia and G. Whitesides, Soft lithography, Annual Review of Materials Science, 28:153–184 (1998)) that polymers can be deposited onto surfaces in patterns with MIMIC, in which indentations in a stamp act as channels to allow capillary filling with some polymer solution or precursor polymer. This requires that all areas to be filled are connected; an isolated pixel cannot be filled by capillary action. MIMIC will also require long filling time, as the size of channels is reduced and length increased. It is therefore not suited for reel-to-reel production. Both the methods according to the invention are in principle compatible with reel-to-reel production, and also allow the patterning of isolated structures.

They are also superior in that the patterning of the polymer layer does not (necessarily) require the previous patterning of the surface, as for instance in Z. Huang, P. C. Wang, J. Feng, A. G. MacDiarmid, Y. Xia, and G. M. Whitesides, Selective deposition of films of polypyrrole, polyaniline and nickel on hydrophobic/hydrophilic patterned surfaces and applications, Synthetic Metals, 85(1–3): 1375–1376 (1997); and Z. Y. Huang, P. C. Wang, A. G. MacDiarmid, Y. N. Xia, and G. Whitesides, Selective deposition of conducting polymers on hydroxyl-terminated surfaces with printed monolayers of alkylsiloxanes as templates, Langmuir 13(24):6480–6484 (1997), and that polymers, not monomers, are deposited.

The preparation of the modified polymer is done in order to tune the cohesive energy of the film, which has to allow the rupturing of the film in both methods; it is also done to tune adhesion to the substrate and/or stamp. The internal cohesion of the film is modified by adding low molecular species in the present case, but could in general be any additive giving this function. It is, of course, essential that the additives are in no way detrimental to the function of the layer, and in the present case the additives are actually beneficial to the function.

When considering the advantages of these methods, we note that Lift-up and Put-down are complementary in the sense that where the former fails, the latter should work. Poor adhesion of the film to be patterned to the substrate suggests that Lift-up should be used; poor adhesion to the stamp suggests that Put-down could be used.

In Lift-up, the polymer film transfer between stamp and surface is used to pick up parts of a PEDOT film from a substrate, by attaching an elastomeric stamp onto the thin film of PEDOT on a fully covered substrate. The molecular contact between film and stamp breaks up the film, and it can now be micropatterned to any topology by this method. The PEDOT film will also now be prepared with the help of additives, and after transfer the film is cured/converted to a higher conductivity by thermal treatment. Features of dimensions down to 10 $\mu$m can easily be patterned. One of the advantages of this technique as compared to MIMIC is that isolated PEDOT pixel can be defined. In this method no solvent is used, which increases the number of materials that can be patterned.

Specifically FIG. 1 relates to the lift-up and shows how a PEDOT film is spin deposited on the substrate. In a second step shown in FIG. 2 a plasma etched poly(dimethylsiloxane) stamp is applied to the thin film and simultaneously heated. The stamp may be plasma etched to obtain an adhesion between the thin film and the stamp which is stronger than the adhesion between the thin film and the substrate. In the subsequent and final step in the Lift-up process, shown in FIG. 3, the stamp is lifted and the thin-film polymer in the form of PEDOT adheres to the protruding portion of the stamps, such that the pattern is formed in the thin film PEDOT on the substrate when the stamp is removed.

In Put-down a slightly modified PEDOT dispersion is coated onto an elastomeric stamp by spin coating. By adding a low molecular weight compound such as ethylene glycol, glycerol or sorbitol in the dispersion, the surface remains sticky enough to attach to another surface brought close. For structures with a large enough spacing between the protruding parts this is sufficient to transfer the PEDOT residing on the upper edge of the structure onto a mating surface, at the right temperature and pressure. With the use of the Put-down method one may be able to transfer films with structures smaller than 100 $\mu$m. This method has the added advantage that no limitation to the topology is caused from the filling of channels with liquid, such as in the MIMIC process. There is also the advantage that the surface to be coated does not need to be planar; actually non-even surfaces can be handled.

It shall now be examples of particularly preferred embodiments according to the invention, including both the lift-up and the put-down processes.

EXAMPLE 1

Lift-up

Poly(3,4-dioxymethylenethiophene)-polystyrenesulfonate (PEDOT-PSS) (Baytron from Bayer AG) is mixed with glycerol to make a 1:2 weight ratio mixture. The mixture is spin-coated into a thin continuous layer on a glass surface. An elastomer stamp formed in poly(dimethylsiloxane) (Sylgard 184, Dow Corning) is plasma-treated for 10 to 30 s in an oxygen plasma. The relief-patterned stamp is brought in conformal contact with the layer, which is then heated to 50–100° C. for 15 to 60 s and subsequently removed with the removal of the elastomer stamp. —As an alternative to glycerol sorbitol could be used, but apparently sorbitol mixed PEDOT-PSS works poorly if at all with Lift-up.

EXAMPLE 2

Lift Up

PEDOT-PSS (Baytron from Bayer AG) is mixed with glycerol to make a 1:1 weight ratio mixture. The mixture is spin-coated into a thin continuous layer on a glass surface. An elastomer stamp formed in poly(dimethylsiloxane) (Sylgard 184, Dow Corning) is plasma-treated for 10 to 30 s in an oxygen plasma. The relief-patterned stamp is brought in conformal contact with the layer, which is then heated to 50–100° C. for 15 to 60 s and subsequently removed with the removal of the elastomer stamp.

EXAMPLE 3

Put-down

PEDOT-PSS (Baytron from Bayer AG) is mixed with ethylene glycol to make a 1:1 molar ratio mixture. An elastomer stamp formed in poly(dimethylsiloxane) (Sylgard 184, Dow Corning) is plasma-treated for 10 s in an oxygen plasma. The relief-patterned stamp is dipped into the mixture and dip-coated. It is brought in conformal contact with an ITO surface and part of the layer is deposited from the stamp onto the ITO, leaving a layer of patterned PEDOT-PSS mixture.

EXAMPLE 4

Put-down

PEDOT-PSS (Baytron from Bayer AG) is mixed with ethylene glycol to make a 1:1 molar ratio mixture. An elastomer stamp formed in poly(dimethylsiloxane) (Sylgard 184, Dow Corning) is plasma-treated for 10 s in an oxygen plasma. The relief-patterned stamp is dip-coated with the mixture. It is brought in conformal contact with an Au surface and part of the layer is deposited from the stamp onto the Au, leaving a layer of patterned PEDOT-PSS mixture.

EXAMPLE 5

Put-down

PEDOT-PSS (Baytron from Bayer AG) is mixed with glycerol to make a 1:1 molar ratio mixture. An elastomer stamp formed in poly(dimethylsiloxane) (Sylgard 184, Dow Corning) is plasma-treated for 10 s in an oxygen plasma. The relief-patterned stamp is dip-coated with the mixture. It is brought in conformal contact with a Cu surface and part of the layer is deposited from the stamp onto the Cu, leaving a layer of patterned PEDOT-PSS mixture.

EXAMPLE 6

Put-down

PEDOT-PSS (Baytron from Bayer AG) is mixed with glycerol to make a 1:1 molar ratio mixture. An elastomer stamp formed in poly(dimethylsiloxane) (Sylgard 184, Dow Corning) is plasma-treated for 10 s in an oxygen plasma. The relief-patterned stamp is dip-coated with the mixture. It is brought in conformal contact with a glass surface and part of the layer is deposited from the stamp onto the glass, leaving a layer of patterned PEDOT-PSS mixture.

EXAMPLE 7

Put-down

PEDOT-PSS (Baytron from Bayer AG) is mixed with glycerol to make a 1:1 molar ratio mixture. An elastomer stamp formed in poly(dimethylsiloxane) (Sylgard 184, Dow Corning) is plasma-treated for 10 s in an oxygen plasma. The relief-patterned stamp is dip-coated with the mixture. It is brought in conformal contact with an Au surface and part of the layer is deposited from the stamp onto the Au, leaving a layer of patterned PEDOT-PSS mixture. The decorated Au surface is exposed to an etchant (gold etch solution: 5 g $I_2$, 10 g KI dissolved in 250 ml $H_2O$) to remove the unprotected Au layer.

What is claimed is:

1. A method for patterning a polymer film forming a coating on a material surface, wherein the patterning takes place by means of a stamp made of an elastomer material and having a surface with at least one indentation formed therein, said method comprising the steps of
    modifying a polymer film material by incorporating one or more additives in order to reduce cohesive binding of a deposited thin film thereof,
    at least one of modifying the material surface in order to provide a weak adhesion between the material surface and the polymer film to be removed therefrom and modifying the elastomer stamp surface in order to provide a strong adhesion between the stamp and the polymer film to be attached thereto,
    depositing onto the material surface a thin film of the modified polymer material,
    applying to the material surface the elastomer stamp in conformal contact with the surface of the deposited polymer film, such that portions thereof contacting one or more protruding elements of the elastomer stamp formed by the at least one indentation thereof are attached to the protruding element or elements and removed from the material surface with the elastomer stamp, and
    leaving a pattern in the thin film of polymer on the material surface when removing the elastomer stamp therefrom.

2. The method according to claim 1, wherein one of the additives is a water-soluble organic compound.

3. The method according to claim 1, wherein one of the additives is selected from the group consisting of ethylene glycol, poly(ethylene glycol), glycerol, sorbitol, polyol, or any combinations thereof.

4. The method according to claim 1, wherein the polymer is a water-soluble or dispersed polymer.

5. The method according to claim 1, wherein the polymer is a conducting conjugated polymer in its doped or undoped state.

6. The method according to claim 1, wherein the polymer is poly(3,4-dioxyethylenethiophene) (PEDOT) or deriving from a copolymer thereof or one or more mixtures incorporating the monomer (EDOT) form.

7. The method, according to claim 1, wherein the modifying of the material surface is by plasma etching.

8. The method according to claim 1, wherein the modifying of the elastomer stamp surface is by plasma etching.

9. The method according to claim 1, further comprising enhancing the adhesion between the elastomer stamp and the polymer film by means of additives to the latter.

10. The method according to claim 9, wherein one of the additives is glycerol.

11. A method for transferring a patterned polymer film onto a material surface by means of a stamp made of an elastomer and having a surface with at least one indentation formed therein, said method comprising the steps of
    modifying a polymer film material by incorporating one or more additives in order to reduce the cohesive binding of a deposited thin film thereof,
    at least one of modifying the elastomer stamp surface in order to provide a weak adhesion between the elastomer surface and the polymer film to be removed therefrom and modifying the material surface in order to provide a strong adhesion between the material surface and the polymer film to be transferred thereto,
    depositing onto the stamp surface a thin film of the modified polymer material,
    applying the elastomer stamp with the polymer film in conformal contact with the material surface, such that the polymer film is transferred thereto from one or more protruding elements of the elastomer stamp formed by the at least one indentation thereof, and
    leaving a patterned thin film of polymer on the material surface when removing the elastomer stamp therefrom.

12. The method according to claim 11, wherein one of the additives is a water soluble organic compound.

13. The method according to claim 11, wherein one of the additives is selected from the group consisting of ethylene glycol, poly(ethylene glycol), glycerol, sorbitol, polyol, or any combinations thereof.

14. The method according to claim 11, wherein the polymer is a water-soluble or dispersed polymer.

15. The method according to claim 11, wherein the polymer is a conducting conjugated polymer in its doped or undoped state.

16. The method according to claim 11, wherein the polymer is poly(3,4-dioxyethylenethiophene) (PEDOT) or deriving from a copolymer thereof or one or more mixtures incorporating the monomer (EDOT).

17. The method according to claim 11, wherein the modifying of the elastomer stamp surface is by plasma etching.

18. The method according to claim 11, wherein the modifying of the material surface is by plasma etching.

19. The use of a method according to claim 11 to provide a patterned etch resist in the form of a thin film of polymer on a gold layer, whereby the gold layer is removed by etching of the area unprotected by the resist, the polymer being PEDOT.

* * * * *